United States Patent [19]

Scifres et al.

[11] 3,969,686
[45] July 13, 1976

[54] BEAM COLLIMATION USING MULTIPLE COUPLED ELEMENTS

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[22] Filed: Mar. 26, 1975

[21] Appl. No.: 562,279

[52] U.S. Cl. .............................. 331/94.5 H; 357/18
[51] Int. Cl.² ............................................. H01S 3/19
[58] Field of Search ............... 331/94.5 H; 357/18, 357/17, 16

[56] References Cited
UNITED STATES PATENTS

| | | | |
|---|---|---|---|
| 3,248,671 | 4/1966 | Dill et al. | 331/94.5 H |
| 3,868,589 | 2/1975 | Wang | 357/18 X |

OTHER PUBLICATIONS

Kazarinov et al., *Injection Heterojunction Laser with a Diffraction Gratine*, Soviet Physics–Semiconductors, vol. 6, No. 7, Jan. 1973, pp. 1184–1189.
Nakamura et al., *Analysis of . . . Double Heterojunction . . . With Corrugated Interface*, Optics Communications, vol. 11, No. 1, May 1974, pp. 18–20.
Nakamura et al., *Distributed–Feedback Diode Lasers*, Applied Physics Letters, vol. 25, No. 9, Nov. 1, 1974, pp. 487–488.

*Primary Examiner*—Eugene La Roche
*Attorney, Agent, or Firm*—John E. Beck; Terry J. Anderson; Leonard Zalman

[57] ABSTRACT

An electrically pumped, distributed feedback laser having all side surfaces of the active laser medium cleaved and a periodic structure at a 45° angle to all of the cleaved surfaces. Current confining channels restrict pumping current to selected regions of the active laser medium to provide sufficient feedback such that two parallel filamentary areas of the active medium lase. By having multiple lasing filaments the divergence of the output beam in the direction of the width of the filaments is reduced by a factor proportional to the number of filamentary lasing areas.

9 Claims, 9 Drawing Figures

U.S. Patent   July 13, 1976   Sheet 1 of 2   3,969,686

BEAM COLLIMATION USING MULTIPLE COUPLED ELEMENTS

BACKGROUND OF THE INVENTION

In U.S. Pat. application No. 515,120, filed Oct. 15, 1974, there is disclosed an electrically pumped, distributed feedback heterojunction diode laser which produces a highly collimated, polarized output light beam which is emitted perpendicular to the plane of the PN junction of the laser rather than through cleaved end faces in the plane of the PN junction. The diode laser includes a periodic structure buried at a heterojunction interface with the periodic structure producing the feedback necessary for lasing and, when the spacing of the teeth of the periodic structure is equal to an integer number of wavelengths of the light photons in the laser medium, the periodic structure provides an output beam perpendicular to the plane of the PN junction. In order to increase the intensity of this output beam, by limiting the light escaping from the sides of the laser, the external surfaces of the laser are cleaved and coated with highly light reflective films. Other laser devices, such as the optically pumped lasers disclosed in U.S. Pat. Nos 3,308,395 and 3,248,671, limit the escape of laser light by regulating the geometrical configuration of the active laser medium such that the light photons produced by the laser are internally reflected by striking successive faces of the laser medium at angles greater than the critical angle of the material of the laser medium until they arrive at an output area at a predetermined location on the surface of an edge of the laser medium.

In conventional solid state diode lasers, such as the laser of U.S. Pat. No. 3,308,395, the divergence of the output beam is large, a typical beam divergence in one direction being 10° and in the other direction being 30°–40°. The electrically pumped solid state, distributed feedback laser of the aforementioned copending U.S. patent application produces an output beam having an angular divergence of only approximately 0.35° in a direction along the length of the teeth of the periodic structure and of approximately 10° in the direction across the teeth of the periodic structure. If the latter divergence could be reduced, the electrically pumped, solid state distributed feedback laser output beam would approach the very small angular divergence of a gas laser output beam and would be useful in many applications where gas lasers are now used.

OBJECTS OF THE INVENTION

It is therefore an object of the present invention to provide an electrically pumped, solid state distributed feedback laser that has an output beam of reduced divergence.

It is another object of the present invention to provide an electrically pumped, solid state distributed feedback laser having an output beam which is perpendicular to the active region of the laser and which has reduced divergence.

It is a further object of the present invention to provide a solid state laser which provides output coupling in a totally internally reflecting laser geometry.

SUMMARY OF THE INVENTION

In accordance with the invention, the foregoing objects are achieved by an electrically pumped, distributed feedback, solid state laser in which all four sides of the laser are cleaved to provide a high gain, low loss path within the active laser medium and in which the periodic structure is placed at right angles to two of the laser filaments of the active laser medium. To provide an output beam perpendicular to the active laser medium, the spacing of the teeth of the periodic structure is made equal to an integer number of wavelengths of the light photons in the active medium of the laser. With this structure, the divergence along the length of the teeth of the periodic structure will be approximately 0.35°, with the divergence in the other direction, that is, across the teeth of the periodic structure being only approximately 5° since two filaments instead of one will be lasing. In order to control which portions of the active laser medium lase, so as to control the path that the totally reflected beam travels, striped geometry configurations, such as striped substrate, proton implanted, ion implanted, planar stripe, buried stripe or mesa stripe geometries may be utilized. These geometries have the added advantage of reducing threshold current and making continuous wave, room temperature operation possible.

DESCRIPTION OF THE PREFERRED EMBODIMENT

Figure 1:
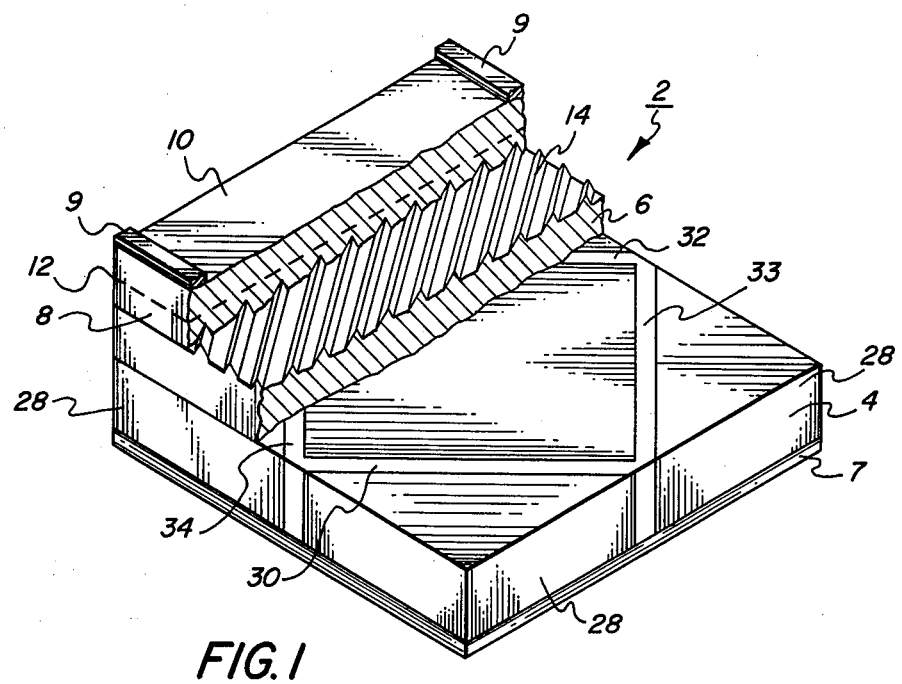
FIG. 1 is a partially cutaway perspective view of a laser in accordance with the invention.
Figure 2:
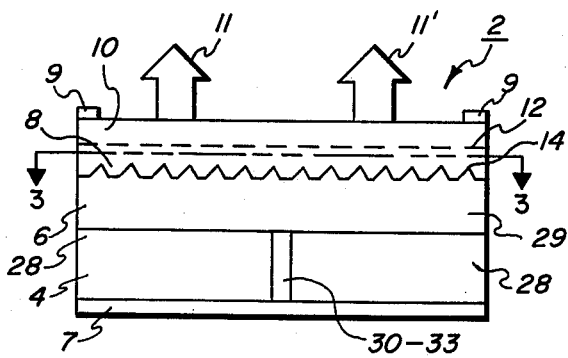
FIG. 2 is a front view of the laser of FIG. 1.

Referring to FIG. 1, there is shown an electrically pumped, solid state, distributed feedback, single heterojunction, diode laser 2 in accordance with the invention. Basically, the laser of FIG. 1 consists of a p-type gallium arsenide layer 4, a p-type gallium aluminum arsenide layer 6, a p-type gallium arsenide layer 8, and an n-type gallium arsenide substrate layer 10. Due to layers 8 and 10 being of different conductivity types, a PN junction 12 exists at the interface of layers 8 and 10. A toothed periodic structure 14, having a spacing between teeth that is an integer number of wavelengths of the light photons guided in the active laser medium 8 is provided at the interface of layers 6 and 8. Metallic contacts 7 and 9 are affixed to, and make non-rectifying contact with, layers 4 and 10, respectively, to enable electrical pumping of the laser 2. Contact 9 can be strip-like to allow the output beam (shown schematically as beams 11 and 11′ in FIG. 2) to exit the laser through layer 10.

Figure 3:
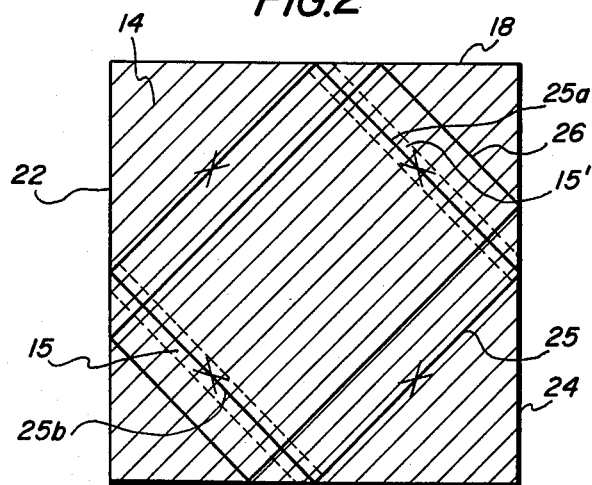
FIG. 3 is a top view of the laser of FIG. 2 taken along the line 3——3.

As shown in FIG. 3, the opposite surfaces 18 and 20 and the opposite faces 22 and 24 of the layer 8 of the device 2 are made optically flat and parallel to each other and perpendicular to each adjacent face by the well known cleaving technique. In accordance with the cleaving technique, crystalline shapes having very high precision optically flat faces are achieved by supporting the crystal on a broad area crystallographic face that is perpendicular to a crystallographic plane having a minimum bond and then applying a cleavage force to the crystal along the minimum bond crystallographic plane. When a rectangular parallel-piped crystal body of gallium arsenide (the material of layer 8) is to be formed, the gallium arsenide crystal body is supported parallel to the (100) crystallographic plane thereof and a force is applied perpendicular to the (100) crystallographic plane along the (110) crystallographic plane of the gallium arsenide crystal.

In operation of the device of FIG. 1, when the PN junction 12 is forward biased, as by connecting electrodes 7 and 9 to the appropriate terminals of a power supply (not shown), light photons or rays are generated in layer 8 as a result of minority carriers being injected into that layer. The rays generated in the active layer 8 travel from their point of origin in many different directions. If a particular ray follows a path or direction such that it strikes the cleaved ends 18, 20, 22 and 24 at an angle of 45°, which angle is greater than the critical angle of the material of the active layer 8, the ray is totally internally reflected with little or no loss of energy. It can be seen in FIG. 3 that ray 25 follows such a path. Of course, other rays such as ray 26, also follow paths that provide total internal reflection.

As discussed in the aforementioned copending U.S. Pat. application No. 515,120, the teeth of a periodic structure placed at a right angle to a light ray produced by stimulated emission will couple and reinforce right and left going light rays travelling through the active region such that there is sufficient feedback to produce lasing. In accordance with the invention, the teeth of the period structure 14 are oriented such that they intersect or intercept two portions of the ray 25 at a 90° angle, that is, the teeth of the periodic structure 14 are at a 45° angle to each of the cleaved end faces 18, 20, 22 and 24. Specifically, the ray 25 intersects the teeth of the periodic structure at right angles along sections 25a and 25b of paths 25, thereby providing the necessary feedback to establish two parallel filamentary laser regions 15 and 15'. Since the teeth of the periodic structure 14 have a spacing equal to an integer number of wavelengths of the light photons generated in, and guided by, layer 8, i.e., the tooth spacing $$\Lambda = \frac{m\lambda_0}{n}$$

where $\lambda_0$ is the free space wavelength of the laser, $n$ is the refractive index of the material of layer 8, and $m$ is an integer, the coherent light produced by the two parallel filamentary laser regions 15 and 15' will be coupled out of the laser at right angles to the PN junction 12, that is, out of the top of layer 10 of the laser 2 as depicted schematically by arrows 11 and 11'.

Along the length of the filamentary laser regions 15 and 15', the divergence of the output beam will be identical to that of the aforementioned copending patent application, that is, approximately 0.35°. However, the divergence in the other direction, that is, across the width of the filamentary laser regions 15 and 15' will be reduced roughly by a factor of two since two parallel filamentary regions are lasing. Thus, the composite of output beams 11 and 11' has less divergence than prior disclosed distributed feedback laser structures. If the output of the lasers is to have a frequency of 8480A, the spacing between the teeth of the periodic structure would be 4693A (which is equal to 2 $\lambda_0/n$).

Since it is necessary to control which filamentary regions lase, it is desirable to restrict the pumping current to those filamentary regions, which in the specific example given would be path sections 25a and 25b. This current confinement is achieved by a striped geometry configuration, several of which are striped substrate, ion implanted, proton implanted, planar stripe, buried stripe or mesa stripe geometries. For example, if proton implantation is used highly resistive regions 28 are formed in layer 4 so that current flow can only be achieved in the unimplanted regions 30, 32, 33 and 34 therebetween. As shown in FIG. 1, regions 28 define two parallel channels 30 and 32 that have a longitudinal dimension perpendicular to the teeth of the periodic structure 14 and are in vertical alignment with the filamentary regions of layer 8 to which they are to confine pumping current, that is, in the specific example given, the channel 30 is in vertical alignment with section 25b of path 25 and the channel 32 is in vertical alignment with section 25a of path 25. Current confinement is achieved by channels 30 and 32, each of which is preferably on the order of ten microns wide with a spacing of greater than 10 microns therebetween. Channels 33 and 34 confine current in the direction parallel to the teeth of the periodic structure 14 and provide a low path between channels 30 and 32. Since layer 6 is made thin, the pump current does not spread substantially and only the portion of the layer 8 vertically in alignment with the channels 30, 32, 33 and 34 is pumped. Due to this confinement, less pumping current is required to provide the current density (amps./cm$^2$)sufficient to initiate lasing at filamentary regions 15 and 15'. Accordingly, less heat is produced by the pumping current and the diode laser 2 can be readily heat sunk to provide continuous wave room temperature operation.

Figure 4A:
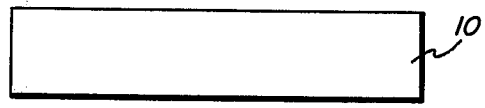
FIGS. 4A–4F are front views showing fabrication steps of the laser of FIG. 1.

The method of fabricating the electrically pumped, solid state distributed feedback laser device 2 of FIG. 1 will now be described in relation to FIG. 4. Fabrication is initiated from a substrate 10 of n-type GaAs having an impurity concentration $N_D$ of about $10^{18}$ cm$^{-3}$, as shown in FIG. 4a. The impurity can be silicon, although other n-type impurities can be used. The lattice orientation of the GaAs substrate 1a is not critical, good results have been achieved using a (100) oriented GaAs substrate, but other orientations, for example, (110) or (111) oriented GaAs should produce good results.

After having been cleaned, such as by an organic solvent and/or by an acid, the periodic structure 14 is formed on the top surface of the substrate 10. The spacing of the teeth of the periodic structure depends upon the lasing wavelength in the GaAs light guiding layer 8, with such relationship being approximately given by the equation:

$$\Lambda \approx \frac{m\lambda}{n}$$

where $\Lambda$ is the spacing of the periodic structure, m is Bragg diffraction order which is a small integer, lambda ($\lambda$) is the free space lasing wavelength, and n equals the refractive index of the GaAs layer 8. For GaAs, lambda ($\lambda$) equals ~8,500A and n is approximately 3.6 such that $\Lambda$ equals approximately 2,400A for m equals 1, approximately 4,800A for m equals 2, and so on.

The production of grating spacings as small as those indicated require either interferometric exposure of a photo-resist material, such as, Shiply AZ 1350 resist, which is laid down on the top surface of substrate 1a in a conventional manner to a depth of approximately 3,600A, or by conventional electron resist techniques. The interferometric exposure technique is conventional and utilizes a beam splitter and two mirrors to direct two laser light beams of equal intensity and equal polarization upon the photoresist with equal angles of incidence. The relationship between the grating spacing and the interferometric exposure is given by the equation:

$$\Lambda = \frac{\lambda_1}{2n\sin\theta}$$

where $\Lambda$ = grating spacing $\lambda_1$ = laser wavelength (not to be confused with the diode laser wavelength $\lambda$)

$\theta$ = the angle between the normal to the substrate surface and the laser beam, and $n$ = refractive index of the medium surrounding the substrate (air = 1).

Figure 4B:
Figure 4C:
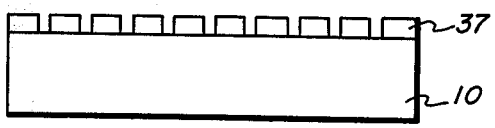

Since an Argon laser is generally used for the interferometric pattern formation and the wavelength of available Argon lasers is approximately 4579A, the grating spacing $\Lambda$ of 4800A ($m$ 2) can be achieved by interfering the laser beam at an angle of about 30°. For $m=2$ the interferometric pattern would be adjusted to expose thin strips of the photoresist 37 spaced about 4,800A apart, with each exposed strip about 2,400A wide, as depicted in FIG. 4b, wherein the darkened areas of resist layer 37 represent the exposed areas. Once the grating pattern is formed on the resist 37, the resist is developed to leave only the unexposed areas still on the top surface of the substrate 10, as shown in FIG. 4c.

Figure 4D:
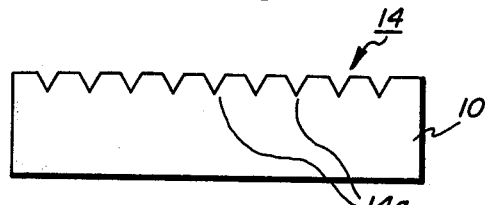

Several possible methods are available for producing the periodic structure in the substrate 10 now partly protected by the resist 37. These methods include ion implantation, ion milling, diffusion, etching or surface milling. It is believed that ion milling produces the best periodic structure. With ion milling, the top surface of substrate 10 is bombarded by Argon ions, or other inert ions, with the ion beam potential being about 4,000 volts and the beam current being about 100 microamps. The resist 37 protects the covered portions of substrate 10, allowing the ion beam to form the teeth or channels 14a in the unprotected areas. It is important that the ion milling process stop when the ion beam has substantially removed most of the resist. If milling persists for too long a period, the grating teeth become narrow and are affected by subsequent process steps. It is also important that the milling be performed at a shallow angle of incidence since pitting of the surface results when the Ar+ beam impinges normal to the plane of the substrate 10. After the grating has been formed, the remaining photoresist is removed by conventional means, such as by an acetone bath. The depth of the teeth 14a of the grating, which depth is important to the distributed feedback action, is about 1800A, but laser operation can be obtained with both shallower and deeper teeth. FIG. 4d is an end view of the substrate 10 with teeth 14a.

Figure 4E:
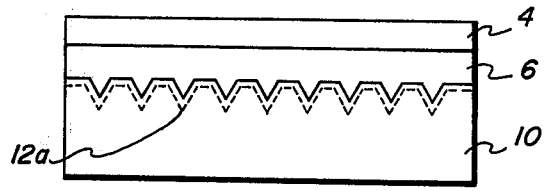

Following cleaning of the substrate, the substrate is placed in a liquid phase epitaxial growth furnace and a p-type $Ga_{1-x}Al_xAs$ layer 6 is grown on the periodic or corrugated surface, followed by growth of p-type GaAs layer 4, as shown in FIG. 4e. The thickness of layer 6 is preferably a few microns, having a dopant level of about $10^{18}$ cm$^{-3}$. The formation of layers 6 and 4 are achieved in a conventional manner and with conventional apparatus. It is, however, important that the growth be done at a low temperature, about 800°C or less, since high temperatures will cause a meltback or dissolution of the periodic structure 14. The concentration of aluminum ($x$) in the $Ga_{1-x}Al_xAs$ is controlled such that the refractive index of the layer 6 is about 3.4 and the band gap is about 1.8 electron volts. As previously explained, these values provide both the required light wave guide structure and the electron confinement. $x$ is 0.3 at the substrate 10-grown layer 6 interface, but it may vary between nearly 0 to 0.8. It is noted in relation to FIG. 4e that during the growth of layer 6, the p-type dopant diffuses slightly into the GaAs substrate 10 as depicted by junction 12a. It is believed that the diffusion extends about 0.5 microns into substrate 10.

Figure 4F:
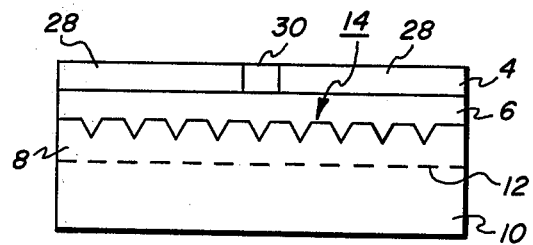

After further cleaning, the device of FIG. 4e is placed in an evacuated diffusion ampoule along with zinc arsenide and diffusion is accomplished for approximately 10 minutes at approximately 700°C. This diffusion drives p-type material further into substrate 10 thereby driving the p-n junction 12 further into the substrate 10 to thereby define layer 8, the light guiding layer, as shown in FIG. 4f. The thickness of layer 8 is preferably about 2 microns, although a lesser or greater thickness is possible depending upon the band gap and refractive indices of layers 6 and 10.

Following removal from the diffusion ampoule, the lower surface of substrate 10 (the part of substrate 10 below the junction 12) is polished to remove any zinc diffused therein, to once again expose n-type GaAs material. In some cases it may be desirable to anneal this wafer to optimize the device performance subsequent to the diffusion.

A stripe geometry configuration can now be applied to the p-side of the device. One method for doing this is proton implantation. A wire mask ($\sim 12\mu m$ dia. wire) with a configuration identical to the stripes 30, 32, 33 and 34 is placed in close proximity to the p-side (layer 4) of the diode such that the wires make 45° angles to the (110) cleave planes 18, 22, 20 and 24. Protons are implanted through layer 4 ($\sim 2\mu m$ deep) in the regions 28 which are not protected by the wire mask. This creates a highly resistive layer 28 with conductive channels 30, 32, 33 and 34 defined where the wire mask protected the wafer from the implant. These conductive regions 30, 32, 33 and 34 therefore define the path of current flow in the device.

Metallized contacts 7 and 9 are then applied to the device by conventional techniques. If a transparent contact is used for 9, then 9 can cover the entire top surface of the device. The four facets 18, 20, 22 and 24 are now cleaved in a square or rectangular configuration so that the device is totally internally reflecting in the plane of the PN junction 12. However, light is coupled out of the diode by the grating 14 in a collimated fashion, the collimation of which increases as more filaments (like 30 and 32) are added which run perpendicular to the grating 14.

The improved laser device has been illustrated and described as utilizing two parallel filamentary areas which provide reduced beam divergence. Obviously, further beam divergence can be achieved by coupling more filamentary areas of the laser. Although the invention has been described with reference to a single heterojunction distributed feedback diode laser, it is equally applicable to other types of electrically pumped ditributed feedback diode lasers such as the double heterojunction type.

What is claimed is:

1. A heterojunction diode laser comprising:
   a light waveguide layer of semiconductor material, said waveguide layer being sandwiched between first and second adjacent layers of semiconductor material with at least one of said adjacent layers being of a different material than the material of said waveguide layer, one of said adjacent layers being of a different conductivity type than the conductivity type of said waveguide layer such that a PN junction is formed therebetween,
   means for electrically pumping at least two spaced parallel regions of said waveguide layers so that light photons are generated in and travel throughout said waveguide layer,
   means for substantially totally internally reflecting said light photons so that at least a portion of said light photons follow a path within said waveguide layer which path has sections which are in alignment with said spaced parallel regions of said waveguide layer, and
   a periodic structure within said diode laser, said periodic structure having a plurality of parallel teeth which are oriented such that their projections are perpendicular to said spaced parallel regions such that said portion of said light photons will be reinforced in a coherent manner thereby providing the feedback necessary to produce two parallel output light beams.

2. The heterojunction diode laser of Claim 1 wherein said waveguide layer is GaAs and said at least one of said adjacent layers is GaAlAs.

3. The heterojunction diode laser of Claim 1 wherein said means for substantially totally internally reflecting said light photons is the cleaved surfaces of said light waveguide layer.

4. The heterojunction diode laser of Claim 3 wherein said teeth make a 45° angle to all of said cleaved surfaces.

5. A heterojunction laser comprising:
   a light waveguide layer of semiconductor material, said waveguide layer being sandwiched between first and second adjacent layers of semiconductor material with at least one of said adjacent layers being of a different material than the material of said waveguide layer, one of said adjacent layers being of a different conductivity type than the conductivity type of said waveguide layer such that a PN junction is formed therebetween,
   means for electrically pumping at least two spaced parallel regions of said waveguide layers so that light photons are generated in and travel throughout said waveguide layer,
   means for substantially totally internally reflecting said light photons so that at least a portion of said light photons follow a path within said waveguide layer which path has sections which are in alignment with said spaced parallel regions of said waveguide layer, and
   a periodic structure within said diode laser, said periodic structure having a plurality of parallel corrugations which are oriented such that their projections are perpendicular to said spaced parallel regions, said corrugations having a spacing therebetween equal to an integer number of wavelengths of said light photons such that said portion of said light photons will be reinforced in a coherent manner thereby providing the feedback necessary to produce two parallel output light beams perpendicular to the plane of said PN junction.

6. The heterojunction diode laser of Claim 5 wherein said means for substantially totally internally reflecting said light photons is the cleaved surfaces of said light waveguide layer.

7. The heterojunction diode laser of Claim 5 wherein said means for electrically pumping said at least two spaced parallel regions of said waveguide layer are elongated portions of one of said adjacent layers with said elongated portions surrounded by highly electrically resistive portions of said one of said adjacent layers.

8. The heterojunction diode laser of Claim 3 wherein said means for electrically pumping said at least two spaced parallel regions of said waveguide layer are elongated portions of one of said adjacent layers with said elongated portions surrounded by highly electrically resistive portions of said one of said adjacent layers.

9. A heterojunction diode laser comprising:
   a light waveguide layer of semiconductor material, the side surfaces of said waveguide layer being cleaved and said layer being sandwiched between first and second adjacent layers of semiconductor material with at least one of said adjacent layers being of a different material than the material of said waveguide layer, one of said adjacent layers being of a different conductivity type than the conductivity type of said waveguide layer such that a PN junction is formed therebetween,
   means for electrically pumping at least two spaced parallel regions of said waveguide layer oriented at a 45° angle to said surfaces of said waveguide layer so that light photons are generated in and travel throughout said waveguide layer, said means including means for restricting pump current flow to only said at least two spaced regions, and
   a periodic structure within said diode laser, said periodic structure having a plurality of parallel teeth which are oriented such that their projections are perpendicular to the longitudinal dimension of said spaced parallel regions, said teeth having a spacing therebetween equal to an integer number of said light photons such that said light photons are reinforced in a coherent manner thereby providing two parallel output light beams perpendicular to the plane of said PN junction.

* * * * *

UNITED STATES PATENT AND TRADEMARK OFFICE
CERTIFICATE OF CORRECTION

PATENT NO. : 3,969,686
DATED : July 13, 1976
INVENTOR(S) : Donald R. Scifres et al It is certified that error appears in the above−identified patent and that said Letters Patent are hereby corrected as shown below:

In column 4, line 20, after "low" insert --loss--.

Signed and Sealed this

Twenty-first Day of September 1976

[SEAL]

Attest:

RUTH C. MASON
*Attesting Officer*

C. MARSHALL DANN
*Commissioner of Patents and Trademarks*